United States Patent
Du et al.

(10) Patent No.: US 12,119,343 B2
(45) Date of Patent: *Oct. 15, 2024

(54) SEMICONDUCTOR STRUCTURE HAVING A SEMICONDUCTOR SUBSTRATE AND AN ISOLATION COMPONENT

(71) Applicant: Silergy Semiconductor Technology (Hangzhou) LTD, Hangzhou (CN)

(72) Inventors: Yicheng Du, Hangzhou (CN); Meng Wang, Hangzhou (CN); Hui Yu, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/886,161

(22) Filed: Aug. 11, 2022

(65) Prior Publication Data
US 2022/0384427 A1   Dec. 1, 2022

Related U.S. Application Data

(63) Continuation of application No. 16/535,391, filed on Aug. 8, 2019, now Pat. No. 11,417,647.

(30) Foreign Application Priority Data

Aug. 17, 2018   (CN) .......................... 201810943003.7

(51) Int. Cl.
*H01L 27/06*   (2006.01)
*H01L 21/761*   (2006.01)
*H01L 49/02*   (2006.01)

(52) U.S. Cl.
CPC ........ *H01L 27/0635* (2013.01); *H01L 21/761* (2013.01); *H01L 28/10* (2013.01)

(58) Field of Classification Search
CPC ... H01L 27/0635; H01L 21/761; H01L 28/10; H01L 21/76237; H01L 29/7816; H01L 21/823481; H01L 23/645; H01L 27/088; H01L 21/822
USPC ...................................................... 257/378
See application file for complete search history.

(56) References Cited

U.S. PATENT DOCUMENTS

| | | | |
|---|---|---|---|
| 5,449,936 A * | 9/1995 | Paparo ................. | H02M 7/219 257/E27.06 |
| 6,121,661 A * | 9/2000 | Assaderaghi .......... | H01L 21/84 257/104 |
| 6,333,532 B1 | 12/2001 | Davari et al. | |
| 6,781,212 B1 | 8/2004 | Kao et al. | |
| 7,018,899 B2 | 3/2006 | Sung | |
| 7,074,659 B2 | 7/2006 | Zuniga et al. | |
| 7,230,302 B2 | 6/2007 | Lotfi et al. | |
| 7,888,222 B2 | 2/2011 | You et al. | |
| 7,981,739 B1 | 7/2011 | You et al. | |
| 7,999,318 B2 | 8/2011 | Zuniga et al. | |
| 8,063,444 B2 | 11/2011 | Chang | |
| 8,119,507 B2 | 2/2012 | You | |

(Continued)

*Primary Examiner* — Duy T Nguyen

(57) ABSTRACT

A semiconductor structure can include: a semiconductor substrate having a first region, a second region, and an isolation region disposed between the first region and the second region; an isolation component located in the isolation region; and where the isolation component is configured to recombine first carriers flowing from the first region toward the second region, and to extract second carriers flowing from the second region toward the first region.

10 Claims, 9 Drawing Sheets

(56) References Cited

U.S. PATENT DOCUMENTS

| | | |
|---|---|---|
| 8,293,612 B2 | 10/2012 | Lee |
| 8,319,283 B2 | 11/2012 | Min et al. |
| 8,431,450 B1 | 4/2013 | Zuniga et al. |
| 8,455,340 B2 | 6/2013 | Zuniga et al. |
| 8,574,973 B1 | 11/2013 | You et al. |
| 8,581,344 B2 | 11/2013 | Liu |
| 8,716,790 B2 | 5/2014 | Lotfi et al. |
| 8,716,795 B2 | 5/2014 | You |
| 8,912,600 B2 | 12/2014 | You |
| 9,121,661 B2 | 9/2015 | Calvete |
| 2004/0084721 A1 | 5/2004 | Kocon et al. |
| 2005/0250289 A1* | 11/2005 | Babcock ............. H01L 29/7378 257/E21.612 |
| 2008/0157150 A1* | 7/2008 | Shim ................. H01L 27/14641 257/292 |
| 2010/0052052 A1 | 3/2010 | Lotfi et al. |
| 2011/0140233 A1* | 6/2011 | Qian ................. H01L 29/66272 257/E21.612 |
| 2012/0139056 A1* | 6/2012 | Wallner .............. H01L 27/0623 257/378 |
| 2012/0261784 A1* | 10/2012 | Roy .................... H01L 27/1464 257/447 |
| 2014/0320174 A1 | 10/2014 | Lu et al. |
| 2016/0043130 A1 | 2/2016 | Ohguro |
| 2016/0104729 A1* | 4/2016 | Favennec .......... H01L 27/14685 438/57 |
| 2016/0284746 A1* | 9/2016 | Fukase .............. H01L 27/14689 |
| 2017/0012136 A1* | 1/2017 | Maegawa ........... H01L 29/7889 |
| 2017/0040446 A1* | 2/2017 | Saito ................... H01L 29/0623 |

\* cited by examiner

SEMICONDUCTOR STRUCTURE HAVING A SEMICONDUCTOR SUBSTRATE AND AN ISOLATION COMPONENT

RELATED APPLICATIONS

This application is a continuation of the following application, U.S. patent application Ser. No. 16/535,391, filed on Aug. 8, 2019, now issued as U.S. Pat. No. 11,417,647, and which is hereby incorporated by reference as if it is set forth in full in this specification, and which also claims the benefit of Chinese Patent Application No. 201810943003.7, filed on Aug. 17, 2018, which is incorporated herein by reference in its entirety.

FIELD OF THE INVENTION

The present invention generally relates to semiconductor technology, and more particularly, to driving chips, semiconductor structures, and associated methods.

BACKGROUND

Voltage regulators, such as DC-to-DC voltage converters, are used to provide stable voltage sources for various electronic systems. Efficient DC-to-DC converters are particularly useful for battery management in low power devices (e.g., laptop notebooks, cellular phones, etc.). A switching voltage regulator can generate an output voltage by converting an input DC voltage into a high frequency voltage, and then filtering the high frequency input voltage to generate the output DC voltage. For example, the switching regulator can include a switch for alternately coupling and decoupling an input DC voltage source (e.g., a battery) to a load (e.g., an integrated circuit [IC], a light-emitting diode [LED], etc.). Lateral double-diffused metal oxide semiconductor (LDMOS) transistors may be utilized in switching regulators due to their performance in terms of a tradeoff between their specific on-resistance ($R_{dson}$) and drain-to-source breakdown voltage ($BV_{d\_s}$).

DETAILED DESCRIPTION

Figure 1:
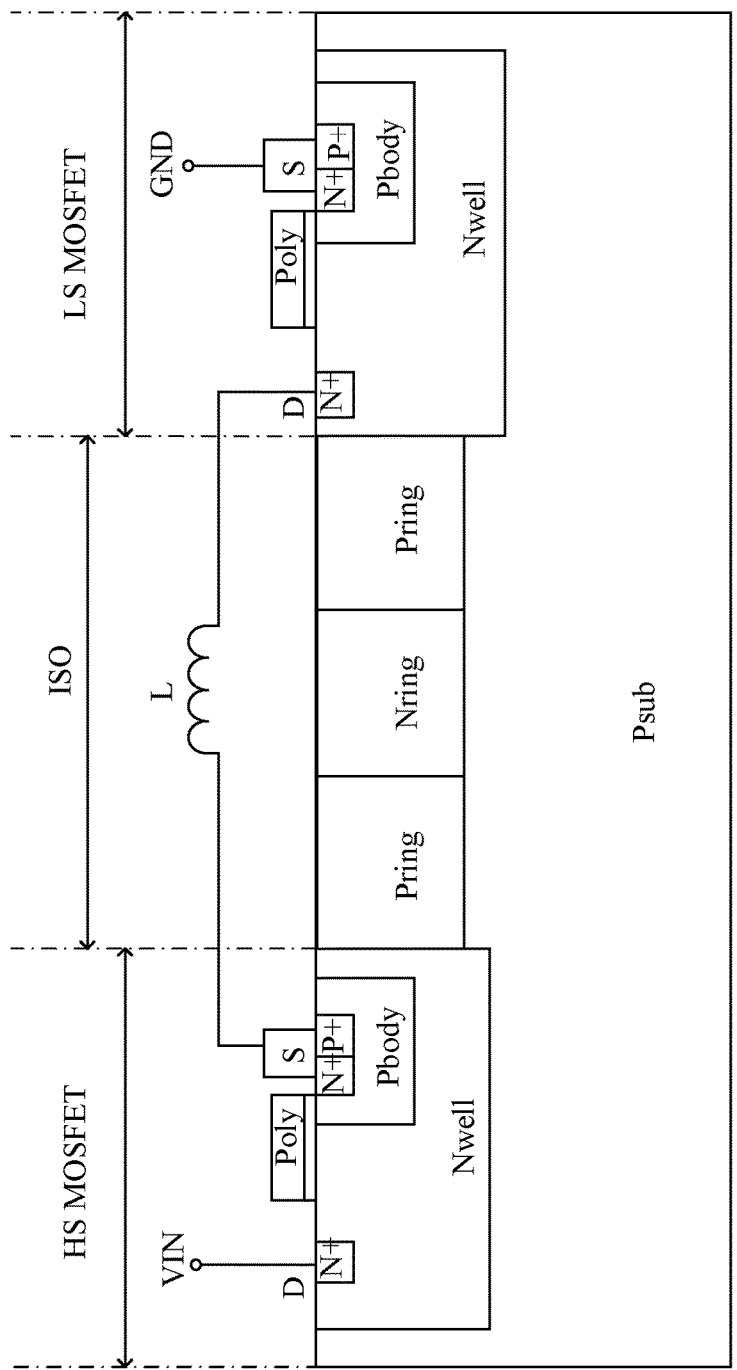
FIG. 1 is a partial cross-sectional diagram of an example motor driving chip.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that includes pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

The power switch in a switching converter/regulator may be a semiconductor transistor (e.g., a metal-oxide-semiconductor field-effect transistor [MOSFET], an insulated gate bipolar transistor [IGBT], etc.). A laterally diffused metal oxide semiconductor (LDMOS) is widely used in switching regulators as the main power switch.

Referring now to FIG. 1, shown is a partial cross-sectional diagram of an example motor driving chip. In interior of a drive chip (e.g., for a motor), multiple half-bridge circuits may be included, and the inductive load can connect between the two half-bridge circuits. In this particular example, high-voltage side HS MOSFET of one of the multiple of half-bridge circuits of the driving chip can be coupled to low-voltage side LS MOSFET of the other half-bridge circuit through inductor L. High-voltage side HS MOSFET and low-voltage side LS MOSFET may both be located in the N-type well region Nwell, both of which can include P-type body region Pbody located in the well region Nwell, source region N+ and body contact region P+ located in body region Pbody, the gate dielectric layer, gate conductor Poly on the gate dielectric layer, and drain region N+. For example, drain electrode D of high-voltage side HS MOSFET can connect to input voltage VIN, the node where source electrode S is connected to the substrate electrode can be coupled to drain electrode D of low-voltage side LS MOSFET through inductor L. Also, source electrode S of the low-voltage side LS MOSFET can connect to the ground voltage GND. During normal operation of the example driving chip shown in FIG. 1, the two half-bridge circuits can realize conduction of the forward MOSFET and the freewheeling process of the reverse body diode through intermediate inductor L.

For example, during the freewheeling process of the reverse body diode, the parasitic PNPN structure between high-voltage side HS MOSFET and low-voltage side LS MOSFET may be in a forward bias state. In addition, PNP (Pbody-Nwell-Psub) and NPN (Nwell-Psub-Nwell) can be turned on in turn. When the collector current (or hole carriers) of the high-voltage side PNP reaches the low-voltage side and acts as the base current of the low-voltage side NPN to promote Nwell of the low-voltage side to inject electrons into substrate Psub, and the collector current (or electron carriers) of the low-voltage side NPN reaches N-type well of the high-voltage side and acts as the base current of the high-voltage side PNP, this can cause the PNPN thyristor to turn on and cause the driving chip to fail due to uncontrolled internal currents.

One solution to this potential problem is to provide isolation region ISO between high-voltage side HS MOSFET and low-voltage side LS MOSFET. Also, P-type isolation ring Pring and N-type isolation ring Nring may be formed in isolation region ISO. P-type isolation ring Pring can absorb the hole carriers injected from the high-voltage side to the low-voltage side, and N-type isolation ring Nring can absorb the electron carriers injected from the low-voltage side to the high-voltage side. However, a relatively large area may be needed to ensure that the chip does not trigger conduction of the PNPN thyristor at rated voltage and rated current.

In particular embodiments, a semiconductor structure can include a semiconductor substrate and an isolation component located in an isolation region of the semiconductor substrate. The semiconductor substrate can also include first and second regions, where the isolation region is located between the first region and the second region. The isolation component can recombine first carriers flowing from the first region toward the second region, and extract second carriers flowing from the second region toward the first region. The isolation component may be electrically connected to an isolation electrode receiving a predetermined electric potential, such that when second carriers flows through the isolation component, most of second carriers are extracted to the isolated electrode and then are discharged.

Furthermore, in order to enable the isolation component to better prevent the flow of the first and second carriers between the first and second regions, a depth of the isolation component in the semiconductor substrate can be greater than a depth of the semiconductor device in the first region along a thickness direction of the semiconductor substrate. Also, the depth of the isolation component in the semiconductor substrate can be greater than a depth of the semiconductor device in the second region. For example, the thickness direction of the semiconductor substrate is perpendicular to a direction in which the first region, the isolation region, and the second region are arranged.

In particular embodiments, the isolation component of the semiconductor structure can block most of the first carriers of the first region from flowing to the second region, and block most of the second carriers of the second region from flowing to the first region. As such, the isolation region may not include a P-type isolation ring and an N-type isolation ring in certain embodiments. Thereby, the area of the isolation region can be effectively reduced, and the overall area of the entire semiconductor structure can also be reduced.

Figure 2:
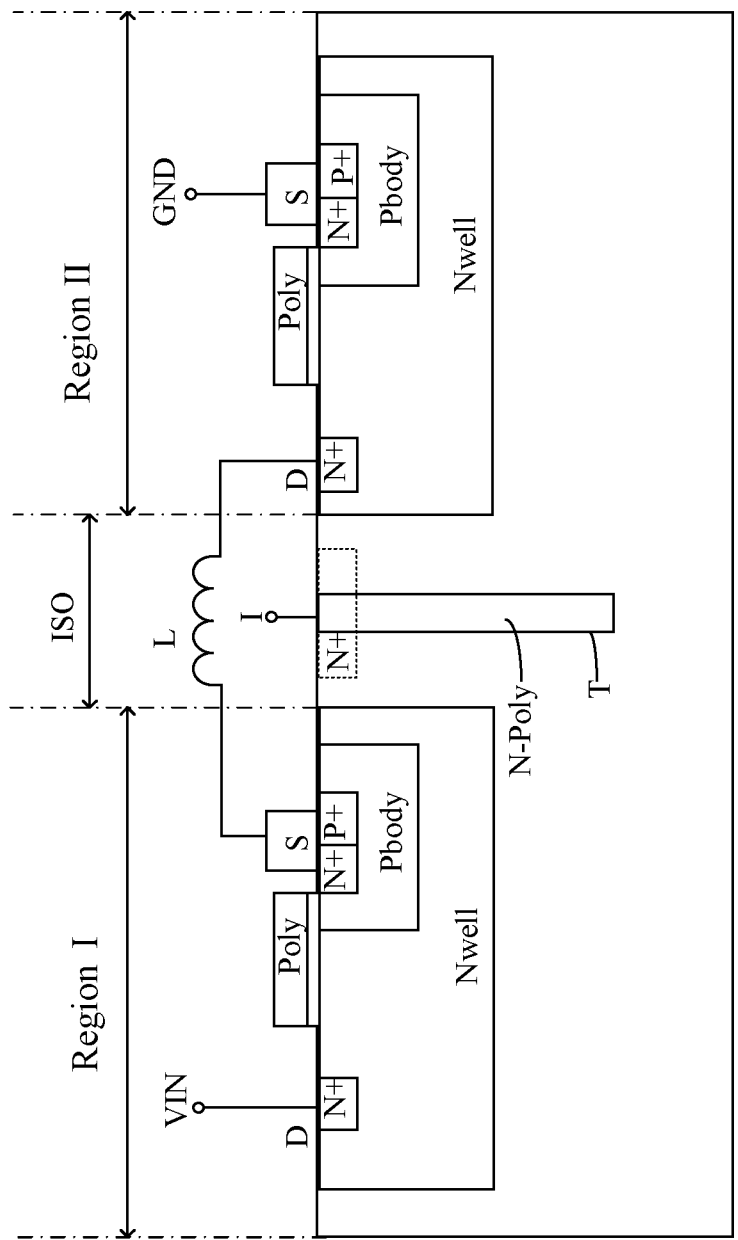
FIG. 2 is a cross-sectional diagram of a first example semiconductor structure, in accordance with embodiments of the present invention.

Referring now to FIG. 2, shown is a cross-sectional diagram of a first example semiconductor structure, in accordance with embodiments of the present invention. Here, the "first" carrier is a hole carrier and the "second" carrier is an electron carrier. Also for example, the portion of the isolation component adjacent to the semiconductor substrate is N-type doped, and an electric potential connected to the isolation component is higher than an electric potential connected to the semiconductor substrate. As such, when hole carriers flow through the position where the isolation component is located along a direction from the first region to the second region, the hole carriers may be recombined by majority carrier of N-type doped region in the isolation component.

When the electron carriers flow through the position where the isolation component is located along a direction from the second region to the first region, since the electric potential of the isolation component is higher than the electric potential of the semiconductor substrate, the electron carriers may flow toward a higher electric potential. Thus, most of the electron carriers may flow into the isolation component to be extracted to the isolation electrode and then can be discharged. That is, most of the electron carriers can be extracted outside the semiconductor substrate through the isolation component. Therefore, the semiconductor structure in certain embodiments can substantially avoid a large number of the electron carriers flowing to the first region, and can substantially avoid a large amount of hole carriers flowing to the second region.

In this example, the semiconductor substrate is P-type semiconductor substrate Psub, region I of semiconductor substrate Psub can include N-type first well region Nwell. For example, region II of semiconductor substrate Psub may include N-type second well region Nwell. A first N-type MOSFET may be disposed in first well region Nwell, and a second N-type MOSFET can be disposed in second well region Nwell. The first and second N-type MOSFETs may each include P-type body region Pbody located in a source area (e.g., the area where a source region of the transistor is located), N-type source region N+ located in body region Pbody, a drain region N+ located in the drain area (e.g., the area where the drain region of the transistor is located), a gate oxide layer located on the surface of semiconductor substrate Psub, and gate conductor Poly located on the gate oxide layer.

Further, the two MOSFETs may also both include P-type body contact region P+ located in body region Pbody. Body contact region P+ can connect to the same electric potential as the source region N+. For example, relative to the second N-type MOSFET, the first N-type MOSFET can be a high-voltage transistor. That is, the voltage applied to the first N-type MOSFET may be greater than the voltage applied to the second N-type MOSFET. For example, the first N-type MOSFET can be configured as a high-voltage side transistor of a first half-bridge circuit, and the second N-type MOSFET may be configured as a low-voltage side transistor of the second half-bridge circuit. Therefore, the first electric potential connected to drain electrode D of the first N-type MOSFET may be greater than the second electric potential connected to source electrode S of the second N-type MOSFET, and source electrode S of the first N-type MOSFET can be coupled to the drain electrode D of the second N-type MOSFET through inductive element L. For example, the first electric potential may be the electric potential of input power source VIN, and the second electric potential may be the electric potential of reference ground GND.

In this particular example, P-type body region Pbody of the first N-type MOSFET, first well region Nwell, and semiconductor substrate Psub may form a parasitic PNP transistor. Also, first well region Nwell, semiconductor substrate Psub, and a N-type region of second N-type MOSFET may form a parasitic NPN transistor. For example, the N-type region is adjacent to semiconductor substrate Psub, and the N-type region is second well region Nwell. In other examples, if region II does not include second well region Nwell, the N-type region may also be drain region N+ of the second N-type MOSFET.

When first and second N-type MOSFETs are both in the off state, the body diodes of the first and second N-type MOSFETs are in a reverse freewheeling state through inductor L, and a parasitic PNPN thyristor formed of the PNP and NPN transistors is in a forward bias state, accompanied by the conduction of the PNP and NPN transistors, the first carriers may flow from the PNP transistor toward the second region, and the second carriers may flow from the NPN transistor toward the first region. If the flow of the first and second carriers is not prevented at this time, when the first carriers reach the second region, which further promotes second well region Nwell to inject the second carriers into the semiconductor substrate Psub, and the second carriers reach the first region, this can cause the PNPN thyristor to turn on and cause the semiconductor structure to fail due to uncontrolled internal currents.

In this particular example, the isolation component is N-type doped, and can include trench T extending from the surface of isolation region ISO toward the inside of semiconductor substrate Psub along the thickness direction. Also, N-doped polysilicon may be filled in the trench. For example, the depth of trench T can be determined according to a voltage and a current that the semiconductor structure needs to withstand, and the greater the voltage and the current, the greater the depth of the trench. In order to enable the isolation component to better recombine the first carriers and extract the second carriers, the depth of the isolation component in semiconductor substrate Psub may be greater than the depth of first well region Nwell in the semiconductor substrate Psub along the thickness direction of the semiconductor substrate Psub. That is, the depth of trench T in the semiconductor substrate Psub may be greater than the depth of first well region Nwell in the semiconductor substrate Psub.

However, since the width of trench T is relatively small, the N-doped polysilicon filled in trench T may be inconvenient to directly contact isolation electrode I. Therefore, in particular embodiments, the isolation component can also include contact region N+ located at a surface of the isolation region, and being in contact with trench T. For example, contact region N+ may be directly located at the top of trench T for contact with the isolation electrode I, and the electric potential of the isolation electrode may be the same as the first electric potential. In certain embodiments, a number of trenches T can be disposed according to the circuit requirements, and may not be limited to strictly one.

Figure 3:
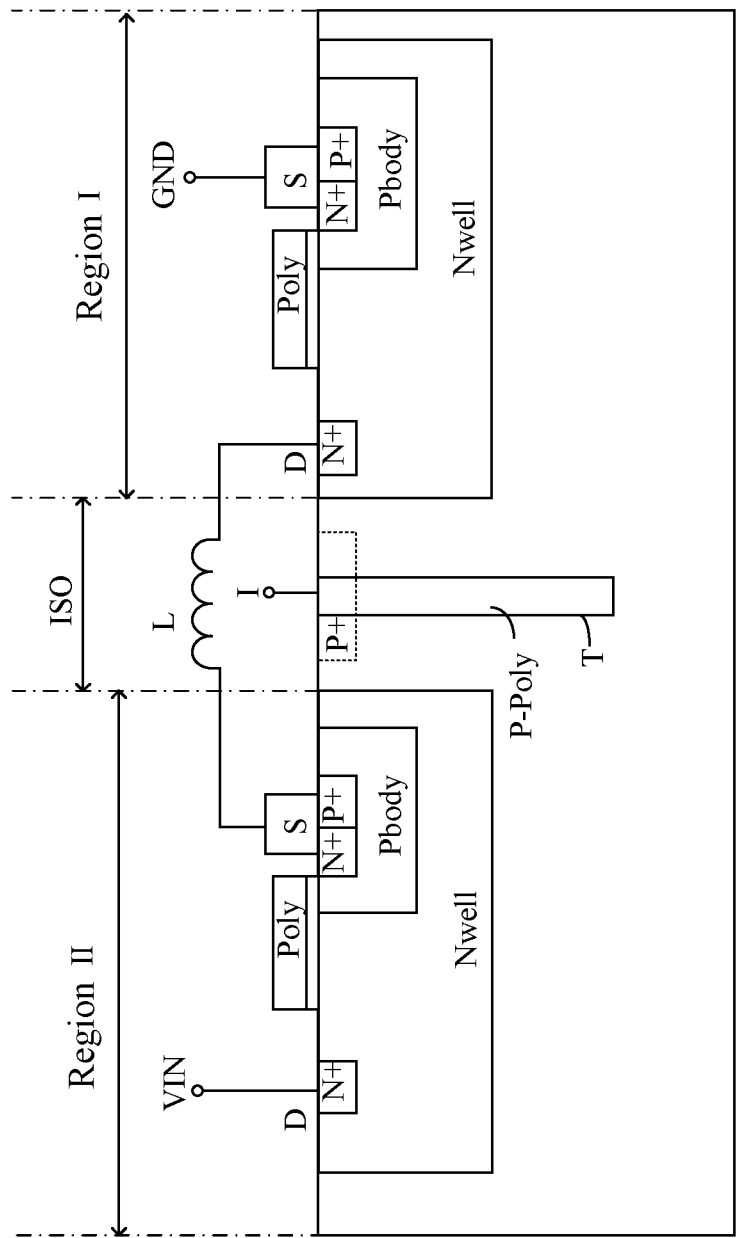
FIG. 3 is a cross-sectional diagram of a second example semiconductor structure, in accordance with embodiments of the present invention.

Referring now to FIG. 3, shown is a cross-sectional diagram of a second example semiconductor structure, in accordance with embodiments of the present invention. In this example, the first carrier is an electron carrier, and the second carrier is a hole carrier. Also, the isolation component is P-type doped, and an electric potential connected to the isolation component may not be higher than an electric potential connected to the semiconductor substrate. Thus, when electron carriers flow through the position where the isolation component is located along a direction from the first region to the second region, the electron carriers can be recombined by majority carrier of P-type doped region in the isolation component. Also, when the hole carriers flow through the position where the isolation component is located along a direction from the second region to the first region (e.g., the electric potential of the isolation component is same as the electric potential of the semiconductor substrate), the hole carriers may flow toward a lower electric potential. Thus, most of the electron carriers flow into the isolation component to be extracted to the isolation electrode and then can be discharged. That is, most of the electron carriers can be extracted outside the semiconductor substrate through the isolation component. Therefore, the semiconductor structure in particular embodiments can substantially avoid a large number of the hole carriers flowing to the first region, and can substantially avoid a large amount of the electron carriers flowing to the second region.

In this particular example, the semiconductor substrate is P-type semiconductor substrate Psub, and region II of semiconductor substrate Psub can include N-type second well region Nwell. Optionally, region I of semiconductor substrate Psub may include N-type first well region Nwell. A first N-type MOSFET may be disposed in first well region Nwell, and a second N-type MOSFET can be disposed in second well region Nwell. Relative to the first N-type MOSFET, the second N-type MOSFET can be a high-voltage transistor. That is, the voltage applied to the second N-type MOSFET may be greater than the voltage applied to the first N-type MOSFET. For example, the second N-type MOSFET can be configured as a high-voltage side transistor of a second half-bridge circuit, and the first N-type MOSFET may be configured as a low-voltage side transistor of the first half-bridge circuit. Therefore, the first electric potential (e.g., input power source VIN) connected to drain electrode D of the second N-type MOSFET can be greater than the second electric potential (e.g., reference ground GND) connected to source electrode S of the first N-type MOSFET. Also, source electrode S of the second N-type MOSFET can be coupled to the drain electrode D of the first N-type MOSFET through inductive element L.

In this particular example, P-type body region Pbody of the second N-type MOSFET, second well region Nwell, and semiconductor substrate Psub may form a parasitic PNP transistor. Also, second well region Nwell, semiconductor substrate Psub, and an N-type region of first N-type MOSFET may form a parasitic NPN transistor. For example, the N-type region may be adjacent to semiconductor substrate Psub, and the N-type region is first well region Nwell. In other examples, if region I does not include first well region Nwell, the N-type region may also be drain region N+ of the first N-type MOSFET. When first and second N-type MOSFETs are both in off state, and the body diodes of the first and second N-type MOSFETs are in reverse freewheeling state through inductor L, when a parasitic PNPN thyristor formed of the PNP and NPN transistors is in a forward bias state, accompanied by the conduction of the PNP and NPN transistors, the first carriers may flow from the PNP transistor toward the second region, and the second carriers may flow from the NPN transistor toward the first region.

In this particular example, the isolation component is P-type doped, and can include trench T extending from the surface of isolation region ISO toward the inside of semiconductor substrate Psub along the thickness direction. Also, a P-doped polysilicon may fill in the trench. For example, the depth of trench T can be determined according to a voltage and a current that the semiconductor structure needs to withstand, and the greater the voltage and the current, the greater the depth of the trench. In order to enable the isolation component to better recombine the first carriers and extract the second carriers, the depth of the isolation component in semiconductor substrate Psub may be greater than the depth of second well region Nwell in the semiconductor substrate Psub along the thickness direction of the semiconductor substrate Psub. That is, the depth of trench T in the semiconductor substrate Psub may be greater than the depth of second well region Nwell in the semiconductor substrate Psub. The isolation component can also include contact region P+ located at a surface of the isolation region, and being in contact with trench T. For example, contact region P+ may be directly located at the top of trench T for contact with isolation electrode I. Of course, one or more than one of trenches T can be disposed according to the particular circuit requirements.

Figure 4:
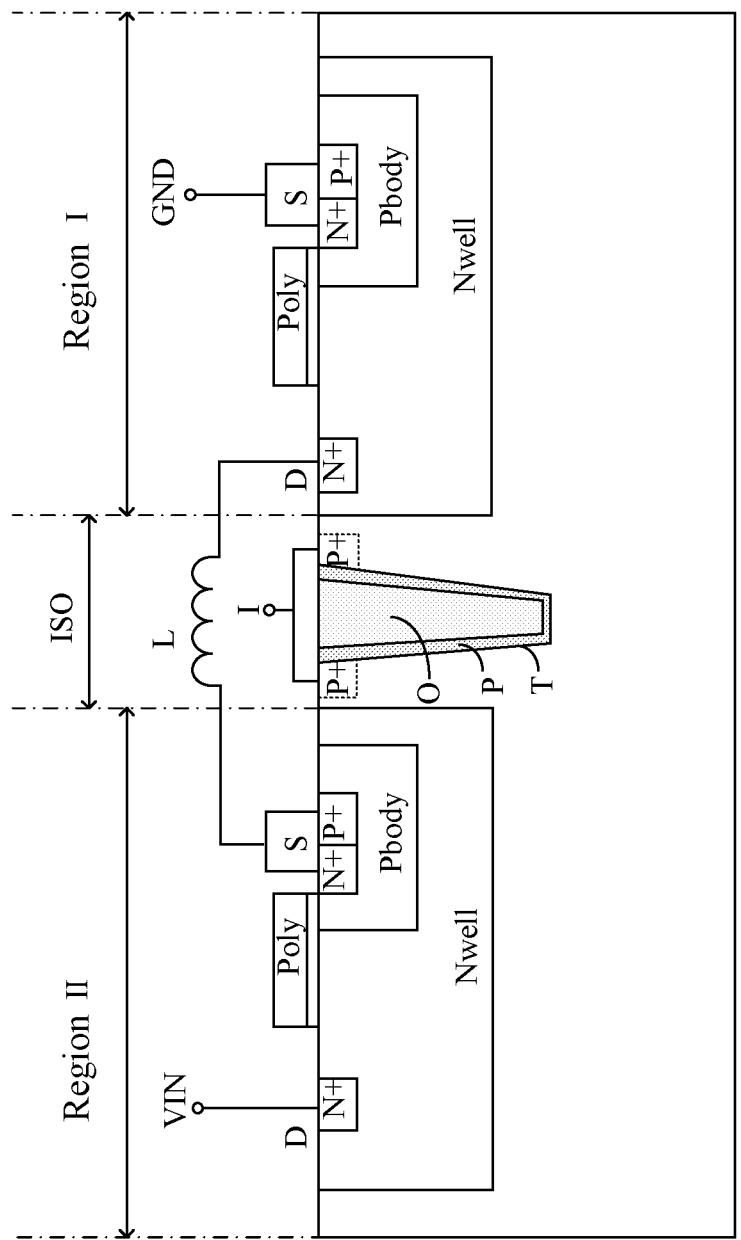
FIG. 4 is a cross-sectional diagram of a third example semiconductor structure, in accordance with embodiments of the present invention.

Referring now to FIG. 4, shown is a cross-sectional diagram of a third example semiconductor structure, in accordance with embodiments of the present invention. In this particular example, trench T of the isolation component may be entirely filled with P-type polysilicon P-Poly. This requires a target containing a P-type dopant, but most of such targets are toxic and not conducive to production. In particular embodiments, to accommodate the region of the isolation component adjacent to semiconductor substrate Psub being a P-type doped region, a P-type dopant may be implanted into the sidewalls and bottom of trench T such that the sidewalls and bottom of trench T are P-type region P. Then, trench T can be filled with a filling material, where the filling material may be an insulating material (e.g., oxide O).

The isolation component may also include contact region P+ located at the surface of isolation region ISO and being in contact with the P-type region of trench T. In this example, contact region P+ may be located at both sides of trench T, in order to better implant the P-type dopant in the sidewalls of the trench to form the P-type region. For example, trench T may be a trapezoidal trench having a top width that is larger than a bottom width. In other examples, the P-type region formed in the sidewalls and bottom of trench T may be replaced with a conductive material including a metal capable of recombining electron carriers.

Figure 5:
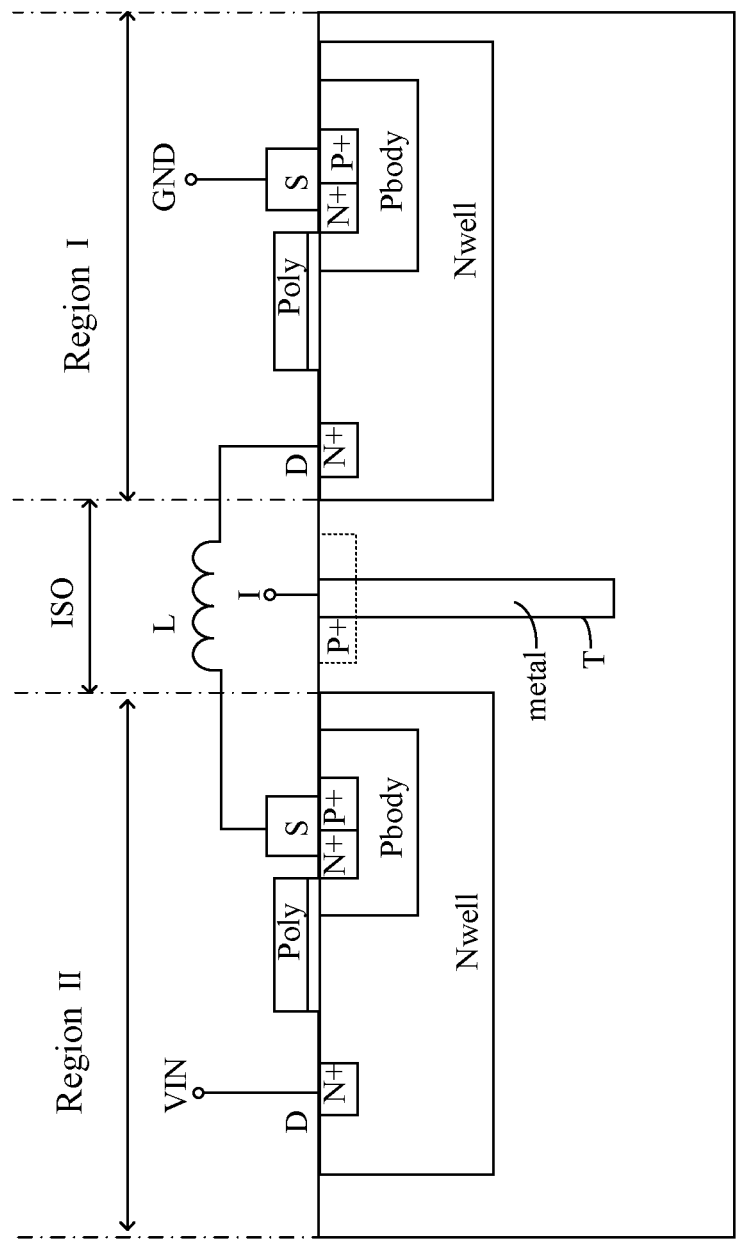
FIG. 5 is a cross-sectional diagram of a fourth example semiconductor structure, in accordance with embodiments of the present invention.

Referring now to FIG. 5, shown is a cross-sectional diagram of a fourth example semiconductor structure, in accordance with embodiments of the present invention. In this particular example, trench T is not filled with P-type polysilicon, but rather is filled with a conductive material containing a metal (e.g., a conductive material containing Ti and TiN), which is capable of recombining electron carriers. Particular embodiments may also include a driving chip (e.g., a motor driving chip). The driving chip can include the semiconductor structure provided herein and an inductive element. The first N-type MOSFET can be configured as a high-voltage side transistor of the first half-bridge circuit in the driving chip, and the second N-type MOSFET can be configured as a low-voltage side transistor of the second half-bridge circuit in the driving chip. Also, a source electrode of the first N-type MOSFET may be coupled to a drain electrode of the second N-type MOSFET through the inductive element. In other examples, the second N-type MOSFET can be configured as a high-voltage side transistor of the second half-bridge circuit in the driving chip, and the first N-type MOSFET may be configured as a low-voltage side transistor of the first half-bridge circuit in the driving chip, where a source electrode of the second N-type MOSFET is coupled to a drain electrode of the first N-type MOSFET through the inductive element.

Particular embodiments may also provide a method of manufacturing a semiconductor structure. The method can include providing a semiconductor substrate having a first region, a second region, and an isolation region located between the first and second regions, and forming an isolation component in the isolation region. When the first carriers flow through the position where the isolation component is located along a direction from the first region to the second region, the electron carriers can be recombined by the isolation component. When the second carriers flow through the position where the isolation component is located along a direction from the second region to the first region, the second carriers may be extracted by the isolation component. Forming the isolation component can include partially etching the semiconductor substrate to form a trench extending from a surface of the semiconductor substrate to the inside of the semiconductor substrate, and forming a doped region or a conductor region containing a metal at least located on sidewalls and a bottom of the trench. The doped region or the conductor region can connect to a predetermined electric potential such that the isolation component can recombine the first carriers and extract the second carriers.

Before forming the isolation component, the method can further include forming a first N-type MOSFET in the first region and forming a second N-type MOSFET in the second region. This can include forming an N-doped first well region and an N-doped second well region in the first region and the second region, respectively, and forming the first N-type MOSFET in the first well region and the second N-type MOSFET in the second well region. The first and second N-type MOSFETs may both include P-type body region, N-type drain, and N-type source region in the P-type body region.

A drain electrode of the first N-type MOSFET can connect to a first electric potential, a source electrode of the first N-type MOSFET may be coupled to a drain electrode of the second N-type MOSFET, and a drain electrode of the second N-type MOSFET can connect to a second electric potential. The first electric potential may be greater than the second electric potential. The first carrier is a hole carrier, and the second carrier is an electron carrier. Also, an N-type doped region may be formed at least on the sidewalls and the bottom of the trench, and the predetermined electric potential can be greater than an electric potential that is connected to the semiconductor substrate.

The drain electrode of the second N-type MOSFET can connect to a first electric potential. A source electrode of the second N-type MOSFET can be coupled to a drain electrode of the first N-type MOSFET. Also, a drain electrode of the first N-type MOSFET can connect to a second electric potential. The first electric potential may be greater than the second electric potential. The first carrier is an electron carrier, and the second carrier is an hole carrier. An P-type doped region or the conductor region can be formed at least on the sidewalls and the bottom of the trench, and the predetermined electric potential may not be higher than the electric potential connected to the semiconductor substrate. For example, the predetermined electric potential can be the that is same as the electric potential connected to the semiconductor substrate.

Figure 6A:
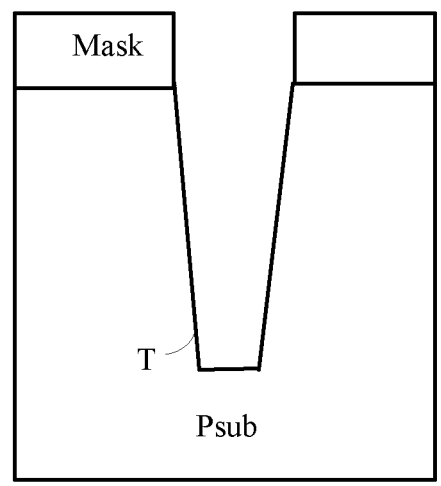
FIGS. 6A-6D are cross-sectional diagrams of various example steps of forming the isolation component, in accordance with embodiments of the present invention.

Referring now to FIGS. 6A-6D, shown are cross-sectional diagrams of various example steps of forming the isolation component, in accordance with embodiments of the present invention. In FIG. 6A, mask "Mask" may be disposed on a surface of semiconductor substrate Psub. The isolation region may be exposed by mask Mask, and the isolation region exposed by mask Mask can be etched to form trench T. For example, trench T is a trapezoidal trench having a top width that is larger than a bottom width.

Figure 6B:
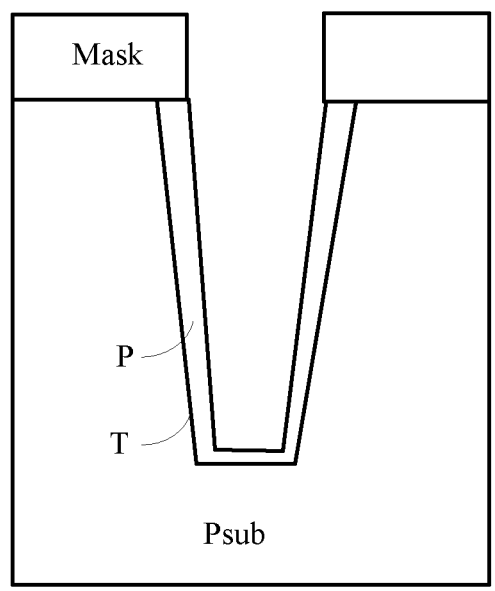

In FIG. 6B, a dopant can be implanted into the trapezoidal trench through mask Mask to form the doped region on the sidewalls and bottom of the trapezoidal trench. For example, a P-type dopant may be implanted to form a P-type doped region P. in other embodiments, an N-type dopant may be implanted to form an N-type doped region.

Figure 6C:
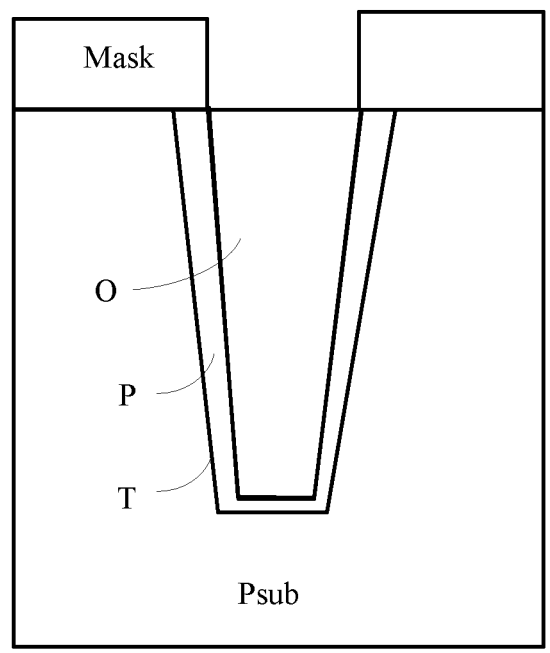
Figure 6D:
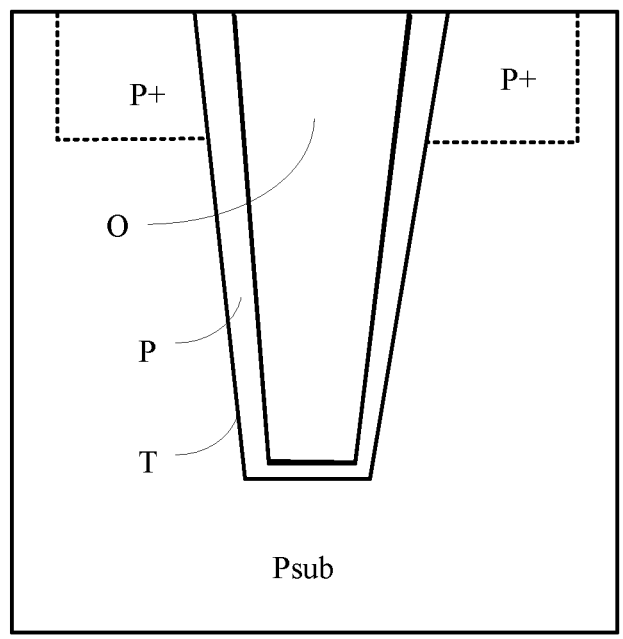

In FIG. 6C, trench T may be filled with a filling material. The filling material may be an insulating material (e.g., an oxide O). In FIG. 6D, a contact region may be formed in the surface of the isolation region. For example, the doped type of the contact region may be same as that of the doped region, such as P-type contact region P+. Also, the contact region can be in contact with the doped region. Furthermore, a contact electrode that is electrically connected to the contact region can also be formed, whereby the contact electrode is connected to a predetermined electric potential.

In addition, the isolation component in particular embodiments may be also used as an electrode structure. The electrode structure can include a semiconductor substrate, a trench extending from an upper surface of the semiconductor substrate to the inside of the semiconductor substrate, a contact region extending from an upper surface of the semiconductor substrate to an inside of the semiconductor substrate, and a filling material filled inside the trench. For example, the contact region may be in contact with both sides of the trench. For example, the filling material may be N-type polysilicon, such that the contact region is N-type doped, and the contact region can connect to high electric potential (e.g., input voltage VIN). In other examples, the filling material may be P-type polysilicon or metal. The contact region can be P-type doped, and the contact region can connect to low electric potential (e.g., ground potential GND).

In particular embodiments, the trench can be a trapezoidal trench having a top width that is larger than a bottom width. The electrode structure can also include a doped region located on the sidewalls and bottom of the trench. The filling material may be a substance in a bipolar-CMOS-DMOS (BCD) process, such as an oxide, or an undoped polycrystalline material, boric acid glass, or metal. For example, the doped type of the contact region is same as that of the doped region. When the contact region is P-type doped, and the contact region is connected to low electric potential (e.g., a ground potential GND), and when the contact region is N-type doped and connected to high electric potential, the high electric potential is greater than the low electric potential.

Further, the electrode structure can also include a well region adjacent to the sidewalls of the trench. The contact region can be located in the well region, and the well region and contact region may be contact with the doped region. When the semiconductor substrate is P-type, the well region may be omitted. However, in other examples, the semiconductor substrate is N-type, and the well region can be used for protecting the contact region to prevent occurring a breakdown between the contact region and the semiconductor substrate. In addition, in order to improve voltage withstanding between the doped region and the semiconductor substrate, the area of the doped region may be further diffused by multiple ion implantation and a relatively long annealing time. Thus, the doping region may be relatively lightly doped and have a relatively large area. The electrode structure can serve as an electron/hole absorption source, and may be used for compositing electron carriers and absorbing hole carriers to prevent parasitic structure from turning on in the semiconductor substrate. Also, the depth of the electrode structure (e.g., the depth of the trench) can be adjusted for different applications.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A semiconductor structure, comprising:
   a) a P-type semiconductor substrate having a first region, a second region comprising an N-type second well region, and an isolation region disposed between the first region and the second region;
   b) an isolation component located in the isolation region;
   c) wherein the isolation component is configured to recombine first carriers flowing from the first region toward the second region, and to extract second carriers flowing from the second region toward the first region, and the electric potential connected to the isolation component is not higher than the electric potential of the semiconductor substrate;
   d) wherein the isolation component comprises a trench and a P-type contact region located on a surface of the isolation region and in contact with the trench, and wherein the isolation component is without an N-type doped region, wherein a depth of the P-type contact region is less than a depth of the trench; and
   e) wherein a second N-type MOSFET is disposed in the second well region and a first N-type MOSFET is disposed in the first region, wherein a parasitic PNP transistor is formed by a P-type body region of the second N-type MOSFET, the second well region, and the semiconductor substrate, and wherein a parasitic NPN transistor is formed by the second well region, the semiconductor substrate, and an N-type region of the first N-type MOSFET.

2. The semiconductor structure according to claim 1, wherein:
   a) the first carrier is electron carrier, and the second carrier is hole carrier; and
   b) the portion of the isolation component adjacent to the semiconductor substrate is P-type doped or a metal-containing conductive material.

3. The semiconductor structure according to claim 2, wherein:
   a) the N-type region is adjacent to the semiconductor substrate;
   b) the second carriers flow from the PNP transistor toward the first region when the PNP transistor is turned on; and
   c) the first carriers flow from the NPN transistor toward the second region when the NPN transistor is turned on.

4. The semiconductor structure according to claim 3, wherein:
   a) the first region comprises an N-type first well region;
   b) the first N-type MOSFET is disposed in the first well region; and
   c) the N-type region is the first well region.

5. The semiconductor structure according to claim 3, wherein:
   a) a drain electrode of the second N-type MOSFET is connected to a first electric potential;
   b) a source electrode of the second N-type MOSFET is coupled to a drain electrode of the first N-type MOSFET;
   c) a drain electrode of the first N-type MOSFET is connected to a second electric potential; and
   d) the first electric potential is greater than the second electric potential.

6. The semiconductor structure according to claim 4, wherein:
   a) the second N-type MOSFET is configured as a high-voltage side transistor of a second half-bridge circuit;
   b) the first N-type MOSFET is configured as a low-voltage side transistor of a first half-bridge circuit; and
   c) a source electrode of the second N-type MOSFET is coupled to a drain electrode of the first N-type MOSFET through an inductive element.

7. The semiconductor structure according to claim 3, wherein a source region of the second N-type MOSFET is located in the P-type body region.

8. The semiconductor structure according to claim 3, wherein a depth of the isolation component in the semiconductor substrate is greater than a depth of the second well region in the semiconductor substrate along a thickness direction of the semiconductor substrate.

9. The semiconductor structure according to claim 2, wherein the isolation component comprises:
   a) the trench extending from the surface of the isolation region toward the inside of the semiconductor substrate along a thickness direction of the semiconductor substrate; and
   b) a P-type doped polysilicon or a metal-containing conductive material filled in the b) trench.

10. A driver chip, comprising the semiconductor structure of claim 3 and an inductive element, wherein:
    a) the second N-type MOSFET is a high voltage side transistor of a second half-bridge circuit in the driving chip;
    b) the first N-type MOSFET is a low voltage side transistor of a first half-bridge circuit in the driving chip; and
    c) the source electrode of the second N-type MOSFET is coupled to a drain c) electrode of the first N-type MOSFET through the inductive element.

* * * * *